(12) United States Patent
Corisis

(10) Patent No.: US 6,920,688 B2
(45) Date of Patent: Jul. 26, 2005

(54) METHOD FOR A SEMICONDUCTOR ASSEMBLY HAVING A SEMICONDUCTOR DIE WITH DUAL HEAT SPREADERS

(75) Inventor: David J. Corisis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/229,835

(22) Filed: Aug. 27, 2002

(65) Prior Publication Data

US 2003/0000082 A1 Jan. 2, 2003

Related U.S. Application Data

(63) Continuation of application No. 09/942,178, filed on Aug. 29, 2001, now Pat. No. 6,518,098, which is a continuation of application No. 09/145,339, filed on Sep. 1, 1998, now Pat. No. 6,326,687.

(51) Int. Cl.[7] .................... H05K 3/30; H01L 21/44; H01L 23/02

(52) U.S. Cl. .................. 29/841; 29/842; 29/827; 29/855; 29/857; 29/830; 438/122; 438/127; 257/678; 257/718; 257/720

(58) Field of Search .................... 29/841, 827, 855, 29/857, 830, 842; 257/690, 678, 694, 696, 718, 720; 438/122, 124, 126, 127

(56) References Cited

U.S. PATENT DOCUMENTS

| | | |
|---|---|---|
| 4,024,570 A | 5/1977 | Hartmann et al. |
| 4,143,456 A | 3/1979 | Inoue |
| 4,209,798 A | 6/1980 | Beretta |
| 4,264,917 A | 4/1981 | Ugon |
| 4,300,153 A | 11/1981 | Hayakawa et al. |
| 4,323,914 A | 4/1982 | Berndlmaier et al. |
| 4,358,552 A | 11/1982 | Shinohara et al. |
| 4,507,675 A | 3/1985 | Fujii et al. |
| 4,642,671 A | 2/1987 | Rohsler et al. |
| 4,688,077 A | 8/1987 | Wakabayashi et al. |
| 4,801,998 A | 1/1989 | Okuaki |
| 4,931,852 A | 6/1990 | Brown et al. |
| 4,961,107 A | 10/1990 | Geist et al. |
| 5,051,275 A | 9/1991 | Wong |
| 5,101,465 A | 3/1992 | Murphy |
| 5,144,747 A | 9/1992 | Eichelberger |
| 5,173,764 A | 12/1992 | Higgins, III |
| 5,194,930 A | 3/1993 | Papathomas et al. |
| 5,214,845 A | 6/1993 | King et al. |
| 5,233,220 A | 8/1993 | Lamson et al. |
| 5,279,029 A | 1/1994 | Burns |

(Continued)

FOREIGN PATENT DOCUMENTS

| | | |
|---|---|---|
| JP | 60-94744 | 5/1985 |
| JP | 60-178651 | 9/1985 |
| JP | 60-180150 | 9/1985 |
| JP | 63-187652 | 8/1988 |
| JP | 4-157758 | 5/1992 |
| JP | 40-52074991 | 3/1993 |
| JP | 40-6097365 | 4/1994 |
| JP | 40-6216284 | 8/1994 |
| JP | 52-77684 | 6/1997 |

Primary Examiner—A. Dexter Tugbang
Assistant Examiner—Tai V Nguyen
(74) Attorney, Agent, or Firm—TraskBritt

(57) ABSTRACT

A method of making an integrated circuit device using an encapsulated semiconductor die, having leads extending therefrom and attaching a heat spreader to each of the major outer encapsulant surfaces thereof, is disclosed. One or both of the heat spreaders has a pair of end posts configured for allowing further encapsulation of portions thereof and insertion into through-holes in a substrate to position and support the device during and following the outer lead solder reflow step at board assembly. The heat spreaders provide high heat dissipation and EMR shielding, and may be connected to the substrate ground to become ground planes.

26 Claims, 10 Drawing Sheets

U.S. PATENT DOCUMENTS

| | | |
|---|---|---|
| 5,311,060 A | 5/1994 | Rostoker et al. |
| 5,349,235 A | 9/1994 | Lee et al. |
| RE34,794 E | 11/1994 | Farnworth |
| 5,377,077 A | 12/1994 | Burns |
| 5,378,924 A | 1/1995 | Liang |
| 5,379,186 A | 1/1995 | Gold et al. |
| 5,379,187 A | 1/1995 | Lee et al. |
| 5,387,554 A | 2/1995 | Liang |
| 5,394,303 A | 2/1995 | Yamaji |
| 5,413,970 A | 5/1995 | Russell |
| 5,420,751 A | 5/1995 | Burns |
| 5,434,105 A | 7/1995 | Liou |
| 5,436,203 A | 7/1995 | Lin |
| 5,446,620 A | 8/1995 | Burns et al. |
| 5,450,283 A | 9/1995 | Lin et al. |
| 5,457,071 A | 10/1995 | Dombroski |
| 5,488,254 A | 1/1996 | Nishimura et al. |
| 5,489,538 A | 2/1996 | Rostoker et al. |
| 5,489,801 A | 2/1996 | Blish, II |
| 5,541,446 A | 7/1996 | Kierse |
| 5,543,664 A | 8/1996 | Burns |
| 5,550,711 A | 8/1996 | Burns et al. |
| 5,552,635 A | 9/1996 | Kim et al. |
| 5,559,306 A | 9/1996 | Mahulikar |
| 5,566,051 A | 10/1996 | Burns |
| 5,592,019 A | 1/1997 | Ueda et al. |
| 5,594,282 A | 1/1997 | Otsuki |
| 5,596,231 A | 1/1997 | Combs |
| 5,598,034 A | 1/1997 | Wakefield |
| 5,619,067 A | 4/1997 | Sua et al. |
| 5,641,997 A | 6/1997 | Ohta et al. |
| 5,656,857 A | 8/1997 | Kishita |
| 5,659,952 A | 8/1997 | Kovac et al. |
| 5,701,034 A | 12/1997 | Marrs |
| 5,815,371 A | 9/1998 | Jeffries et al. |
| 5,828,125 A | 10/1998 | Burns |
| 5,891,759 A | 4/1999 | Otsuki |
| 6,025,642 A | 2/2000 | Burns |
| 6,048,744 A | 4/2000 | Corisis et al. |
| 6,049,123 A | 4/2000 | Burns |
| 6,061,242 A | 5/2000 | Corisis et al. |
| 6,326,687 B1 | 12/2001 | Corisis |
| 6,326,827 B1 | 12/2001 | Cretti et al. |
| 6,418,023 B2 | 7/2002 | Kinsman et al. |

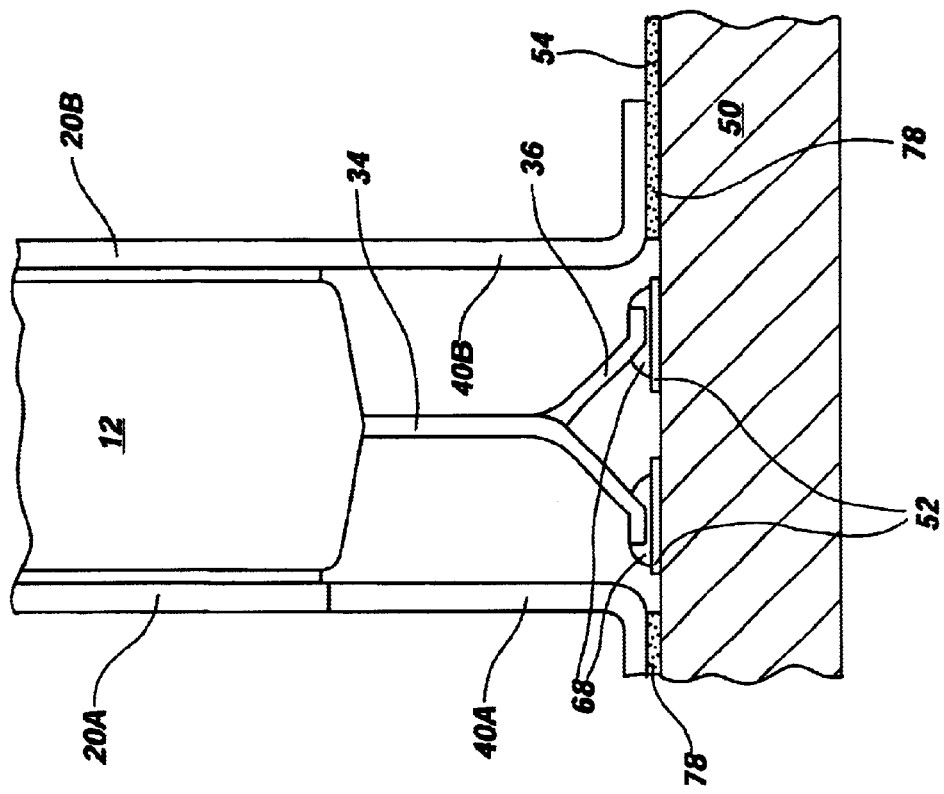
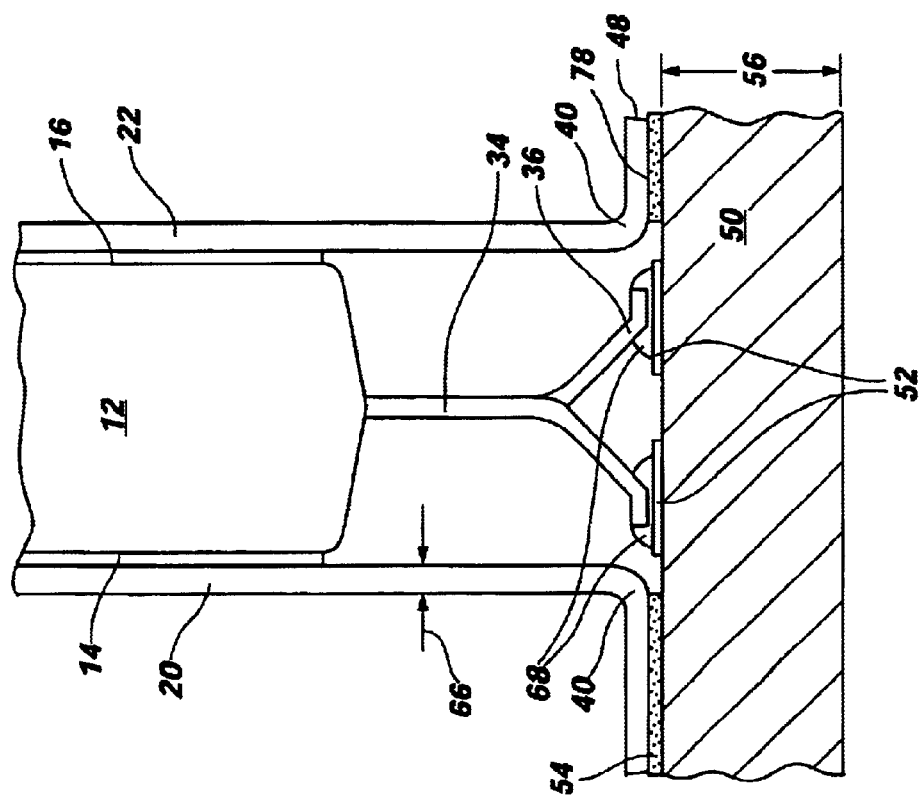

US 6,920,688 B2

METHOD FOR A SEMICONDUCTOR ASSEMBLY HAVING A SEMICONDUCTOR DIE WITH DUAL HEAT SPREADERS

CROSS-REFERENCE TO RELATED APPLICATIONS

This application is a continuation of application Ser. No. 09/942,178, filed Aug. 29, 2001, now U.S. Pat. No 6,518,098, issued Feb. 11, 2003, which is a continuation of application Ser. No. 09/145,339, filed Sep. 1, 1998, now U.S. Pat. No. 6,326,687, issued Dec. 4, 2001.

BACKGROUND OF THE INVENTION

1. Field of the Invention

This invention relates generally to integrated circuit (IC) devices or semiconductor devices. More particularly, the invention pertains to heat spreading apparatus and methods for dissipating heat from integrated circuit devices or semiconductor devices.

2. State of the Art

Integrated circuit devices (ICs) or semiconductor devices are devices including small electronic circuits formed on the surface of a wafer of semiconductor material, such as silicon. The ICs or semiconductor devices are fabricated in a plurality on the surface or as part of a wafer. The wafer is then subdivided into discrete IC or semiconductor device chips or dice, and then further tested and assembled for customer use through various well-known individual die testing and packaging techniques, including lead frame packaging, Chip-On-Board (COB) packaging, and flip-chip packaging (FCP). Depending upon the size of the IC or semiconductor device and the size of the wafer, a wafer may be divided into a few dice or as many as several hundred or more than one thousand discrete dice. The discrete IC or semiconductor device may be subsequently packaged in a variety of manners using lead frames, substrates, etc.

Higher powered, faster integrated circuits and/or semiconductor devices generate heat which, if not dissipated, may overheat the IC and/or semiconductor device, resulting in its failure.

Various means for dissipating heat from ICs and semiconductor devices have been used or proposed. Heat transfer through the metallic leadframe or other conducting wire has been enhanced in different ways, as shown in U.S. Pat. No. 5,541,446 of Kierse, U.S. Pat. No. 4,961,107 of Geist et al., U.S. Pat. No. 5,101,465 of Murphy, U.S. Pat. No. 4,264,917 of Ugon, and U.S. Pat. No. 5,656,857 of Kishita.

U.S. Pat. No. 5,450,283 of Lin et al. discloses a device in which the die surface is left unencapsulated in the packaging step for improved heat dissipation.

Use of an encapsulant composition having enhanced heat conducting properties is shown in U.S. Pat. No. 4,358,552 of Shinohara et al., U.S. Pat. No. 4,507,675 of Fujii et al., U.S. Pat. No. 4,931,852 of Brown et al., and Japanese Patent Application No. 58-202429 of Tanaka. U.S. Pat. No. 5,379,186 of Gold et al. discloses a package comprising inner and outer layers of encapsulant with an intermediate layer of thermally conductive material.

A die support member to which the die is adhesively attached has been used as a heat sink in a variety of configurations. Examples of such are shown in U.S. Pat. No. 5,701,034 of Marrs, U.S. Pat. No. 5,379,187 of Lee et al., U.S. Pat. No. 5,594,282 of Otsuki, U.S. Pat. No. 5,596,231 of Combs, U.S. Pat. No. 5,598,034 of Wakefield, U.S. Pat. No. 4,642,671 of Rohsler et al., U.S. Pat. No. 5,434,105 of Liou, U.S. Pat. No. 5,488,254 of Nishimura et al., U.S. Pat. No. 5,659,952 of Kovac et al., and U.S. Pat. No. 5,489,801 of Blish II.

A single plate of metallic material has been applied to the outside of the package as a heat sink. Such is shown in U.S. Pat. No. 5,552,635 of Kim et al., U.S. Pat. No. 5,173,764 of Higgins III, and U.S. Pat. No. 4,024,570 of Hartmann et al.

In U.S. Pat. Nos. 5,378,924 and 5,387,554 of Liang, a layer of thermal grease is inserted between the die and a heat sink.

U.S. Pat. No. 5,144,747 of Eichelberger, U.S. Pat. No. 5,311,060 of Rostoker et al., and U.S. Pat. No. 5,641,997 of Ohta et al. show IC devices with separate heat sinks within the encapsulant near a wall thereof.

U.S. Pat. No. 4,323,914 of Berndlmaier et al. teaches a heat transfer structure comprising a pool of liquid metal adjacent a parylene-covered die in a semiconductor device.

Various patents show the use of flat and non-flat metal conductors for reducing power-ground loop inductance and increasing capacitance to reduce noise and increase operational speed. See, for example, U.S. Pat. No. 5,214,845 of King et al., U.S. Pat. No. 5,559,306 of Mahulikar, U.S. Pat. No. 5,233,220 of Lamson et al., U.S. Pat. No. 5,436,203 of Lin, and Japanese Patent Application No. 60-178651 of Uno. None of these documents mention heat dissipation.

The various methods of heat dissipation require, in general, complex structures. Routes for moisture leakage into the package result from heat spreaders/sinks that are partially exposed. A new heat spreader construction is needed for producing an integrated circuit device with high heat removal rates and protection against electronic noise and spikes, all at low cost and minimum time expenditure, and without problems of leakage.

BRIEF SUMMARY OF THE INVENTION

The invention comprises a vertical mount integrated circuit (IC) or semiconductor device with dual heat spreaders. The planar heat spreaders are adhesively attached to the opposed major surfaces of the package encapsulant. One or both of the heat spreaders has one or more through-hole posts projecting outwardly to be inserted into through-holes in a substrate. When inserted, the posts align the exterior leads of the device with corresponding leads on the substrate for accurate bonding therebetween. One or both of the heat spreaders may be connected to a ground bus to act as a ground plane.

The heat spreaders of the invention provide enhanced heat dissipation, shielding of the integrated circuit(s) of the IC and/or semiconductor device, and mitigation of transient voltage excursions. The invention is particularly applicable to a vertical mount package that is to be bonded by solder reflow to a substrate such as a circuit board.

BRIEF DESCRIPTION OF THE DRAWINGS

The invention is illustrated in the following exemplary figures, wherein the drawings are not necessarily to scale.

FIG. 7A is a partial cross-sectional view of an IC or semiconductor device of a second embodiment of the invention mounted on a substrate if the cross-section of such invention were taken along line 7—7 of FIG. 1;

FIG. 8A is a partial cross-sectional view of another IC or semiconductor device of the second embodiment of the invention mounted on a substrate, as taken along line 8—8 of FIG. 6.

DESCRIPTION OF THE ILLUSTRATED EMBODIMENTS

Figure 1:
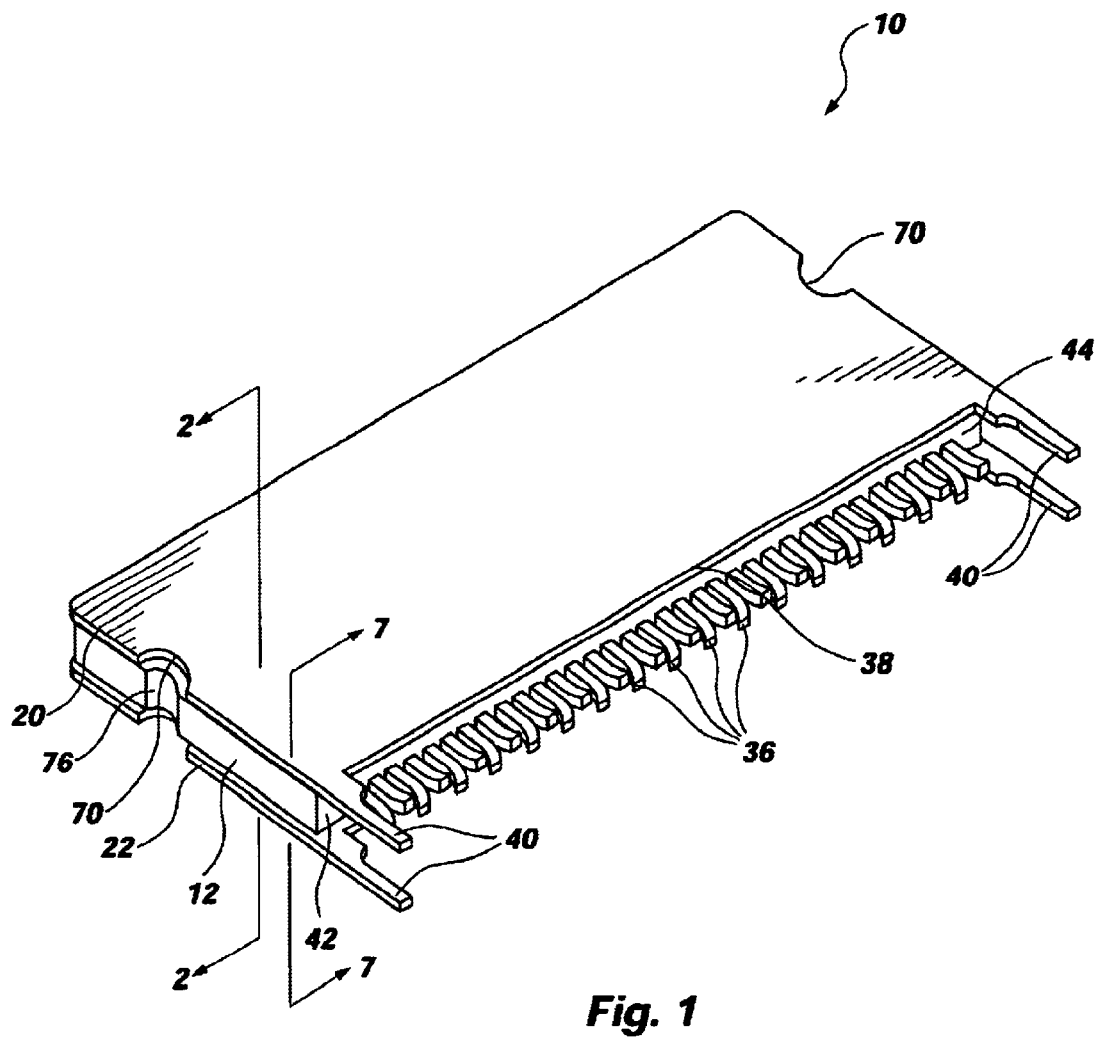
FIG. 1 is a perspective view of a vertical mount IC or semiconductor device having dual heat spreaders of the invention.
Figure 2:
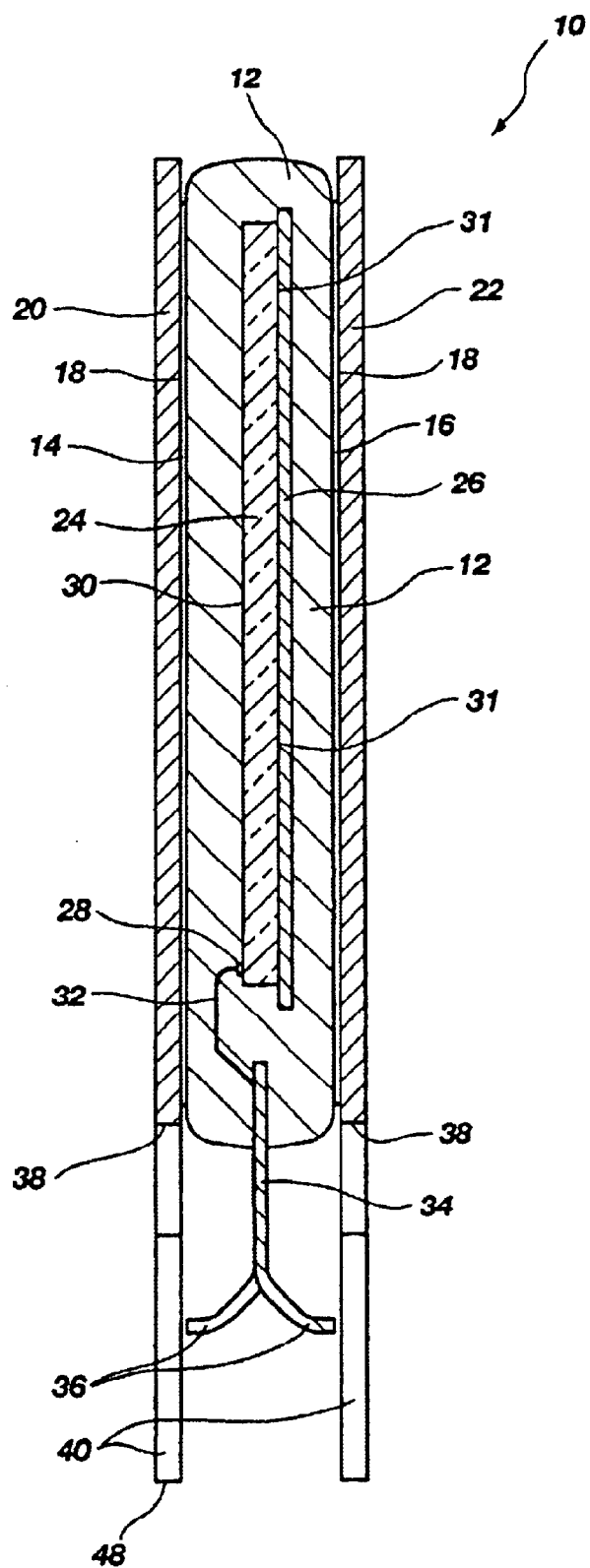
FIG. 2 is a cross-sectional view of an IC or semiconductor device of the invention as taken along line 2—2 of FIG. 1.
Figure 3:
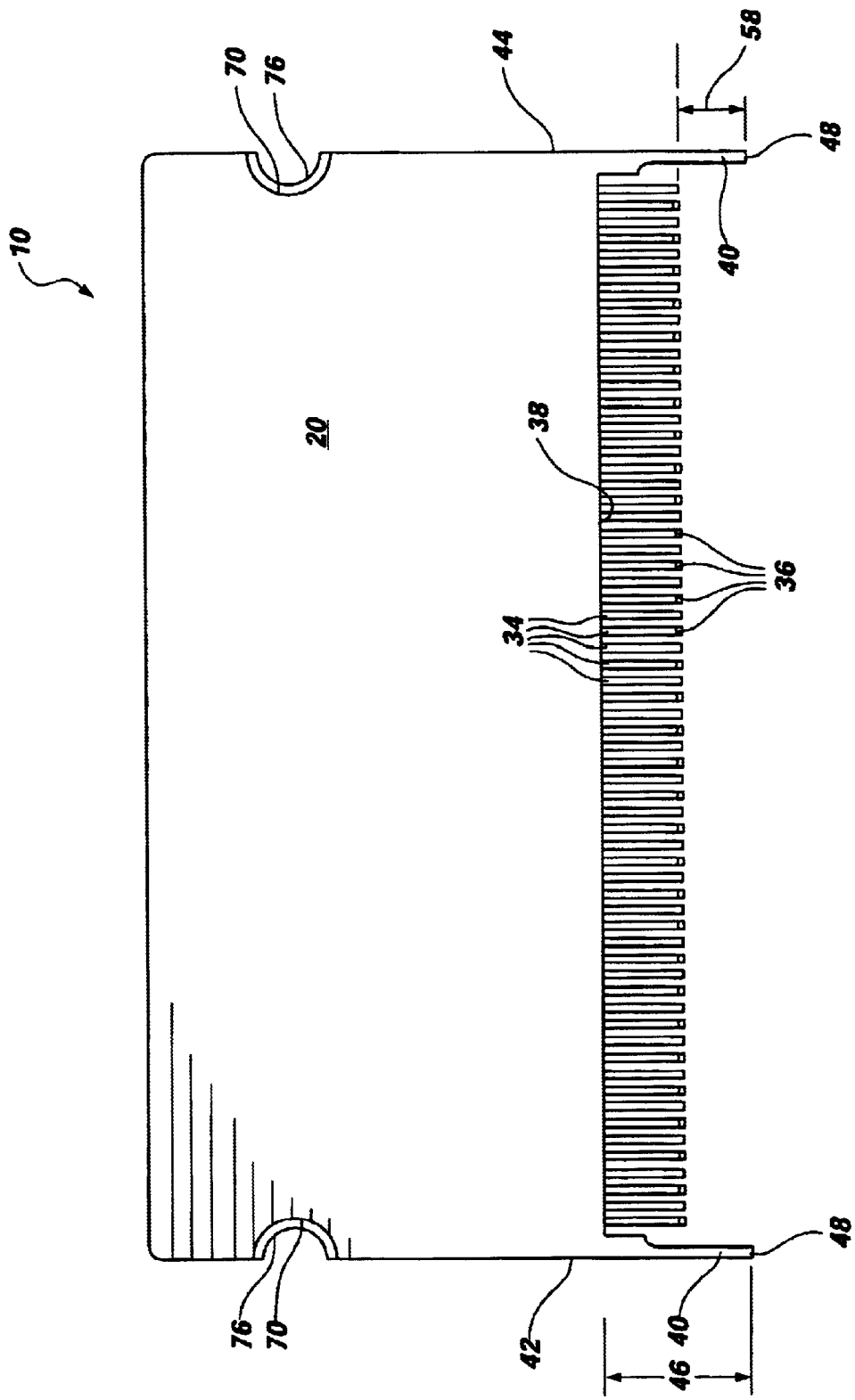
FIG. 3 is a plan view of an IC or semiconductor device of the invention.

One embodiment of the invention is illustrated in FIGS. 1 through 3 and described as follows:

The invention comprises an IC or semiconductor device 10 with dual heat spreaders 20, 22, where the heat spreaders "sandwich" the encapsulation material 12 of the IC or semiconductor device. Each heat spreader 20, 22 is fixed to one of the major external surfaces 14, 16 of the encapsulation material 12, and substantially overcovers the major external surface.

In a preferred form, the heat spreaders 20, 22 are joined to the planar major external surfaces 14, 16 of the encapsulation material 12 with an adhesive material 18. Preferably, the adhesive material 18 has a relatively high coefficient of thermal conductivity and comprises a thin layer. It is also preferable that the adhesive material 18 has a coefficient of thermal expansion (CTE) intermediate between the CTEs of the encapsulation material 12 and the heat spreaders 20, 22. In another preferred form, the adhesive material 18 has a relatively high degree of elasticity to compensate for differences between heat spreader CTE and encapsulant CTE. An adhesive coated tape formed of e.g. polyimide may be used as adhesive material 18 to join the heat spreaders 20, 22 to the encapsulation material 12.

An exemplary IC or semiconductor device 10 is depicted in FIG. 2, being based on an integrated circuit die 24, which has its reverse side 31 down-bonded to a lead frame paddle 26. Electrical bond pads 28 on one end of the active surface 30 of die 24 are bonded by conductive wires 32 to lead fingers 34, whose outer ends comprise exterior leads 36 to be connected to conductors on a substrate (not shown in FIGS. 1–3). Both the active surface 30 and the reverse side 31 comprise generally parallel major surfaces of the die 24.

As will become apparent from the description, the application of heat spreaders in accordance with the invention may be accomplished regardless of the particular IC or semiconductor device configuration.

Figure 2A:
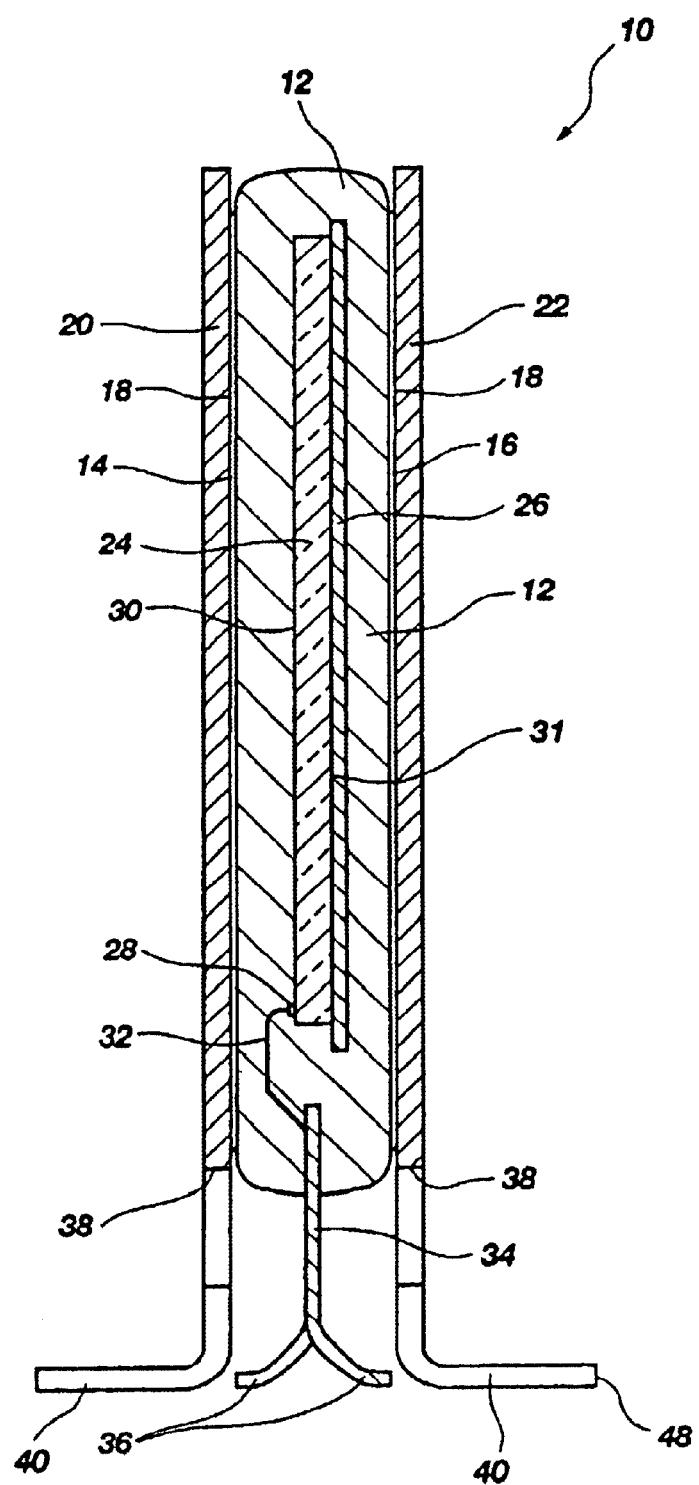
FIG. 2A is a cross-sectional view of a second embodiment of an IC or semiconductor device of the invention, as taken along line 2—2 of FIG. 1.

As shown in FIGS. 1–3 and 7, the heat soreaders 20, 22 are thin planar members or plates formed to substantially overcover the package of encapsulation material 12. A pair of through-hole posts 40 is formed as part of each heat spreader 20, 22, spaced along what will be known herein as the lead edge 38 of the heat spreader. The lead edge 38 is defined as the heat spreader edge proximate the exterior leads 36 of the package. As shown in the figures, the through-hole posts 40 extend outward from each heat spreader 20, 22 at each end 42, 44 of the lead edge 38. The through-hole posts 40 may be located at any location along an edge of the heat spreader 20, 22 where their insertion into a through-hole 60 in a substrate 50 (FIGS. 7 and 8) or other body will accurately position and hold the IC or semiconductor device 10 in place for joining the exterior leads 36 to other leads, for example, by solder reflow to surface conductive traces 52 of a substrate 50. Alternately, as illustrated in FIG. 2A, the through-hole posts 40 extend downwardly and outwardly from each heat spreader 20, 22 at each end 42, 44 of the lead edge 38 for connection to a suitable substrate (not shown) by adhesive bonding, reflow soldering, etc. In these drawings, the substrate 50 is exemplified as a circuit board with a thickness 56 and with surface conductive traces 52 on its upper surface 54. In the substrate 50, through-holes 60 are positioned relative to the surface conductive traces 52 so that precise positioning (and maintenance of the position) of the IC device 10 for lead attachment is readily accomplished.

The through-holes 60 are most easily formed by drilling. The hole diameter 62 is based on the size of the through-hole posts 40, permitting a snug or interference fit therebetween. The minimum cross-sectional dimensions of the through-hole posts 40 depend upon the strength of the heat spreader material. Once the IC device 10 is attached to the substrate 50, the presence of the through-hole posts 40 adds much stability. If desired, additional stability may be attained by inserting a fast curing adhesive material 64 into the through-holes 60 surrounding the through-hole posts 40. The adhesive material 64 may be any of a wide variety of organic adhesives, as known in the art. A similar type adhesive material 64 may be used to bond through-hole posts 40, as illustrated in FIG. 2A, to the substrate 50 to attach the through-hole posts 40 thereto.

Referring to FIG. 2A, an alternative IC or semiconductor device 10 is depicted such as in FIG. 2, being based on an integrated circuit die 24, which has its reverse side 31 down-bonded to a lead frame paddle 26. Electrical bond pads 28 on one end of the active surface 30 of die 24 are bonded by conductive wires 32 to lead fingers 34 whose outer ends comprise exterior leads 36 to be connected to conductors on a substrate (not shown in FIGS. 1–3). Both the active surface 30 and the reverse side 31 comprise generally parallel major surfaces of the die 24.

As shown in FIGS. 1–3 and 7, the heat spreaders 20, 22 are thin planar members or plates formed to substantially overcover the package of encapsulation material 12. A pair of through-hole posts 40 is formed as part of each heat spreader 20, 22, spaced along the lead edge 38 of the heat spreader. The lead edge 38 is defined as the heat spreader edge proximate the exterior leads 36 of the package. As shown in the figures, the through-hole posts 40 extend downwardly and outwardly away from each heat spreader 20, 22 at each end 42, 44 of the lead edge 38. The through-hole posts 40 may be located at any location along an edge of the heat spreader 20, 22 where they are available for subsequent mounting on a substrate 50 or other body, which will accurately position and hold the IC or semiconductor device 10 in place to a substrate 50 or for joining the external leads 36 to other leads, for example, by solder reflow to surface conductive traces 52 and circuit 78 of a substrate 50. In these drawings, the substrate 50 is exemplified as a circuit board that may include surface conductive traces 52 and circuit 78 on its upper surface 54.

As shown in FIG. 3 the through-hole posts 40 may be made of a length 46 such that the post ends 48 extend completely along a desired length 58 of the substrate 50, as shown in FIGS. 2A and 7A.

The through-hole posts 40 may be of any cross-sectional shape or thickness suitable for use on the substrate 50. Typically, the through-hole posts 40 are formed to have a square, or near-square, cross-section having a maximum dimension approximately equal to the thickness 66 of the heat spreader 20 (as shown in FIGS. 7 and 7A).

Figure 7:
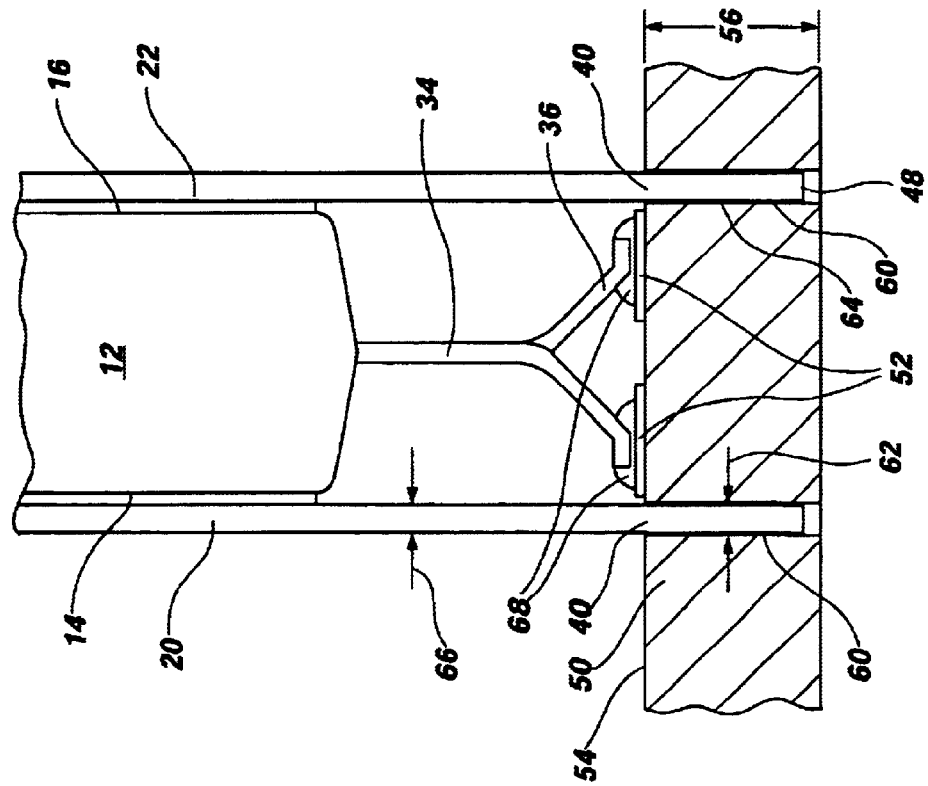
FIG. 7 is a partial cross-sectional view of an IC or semiconductor device of the invention mounted on a substrate as taken along line 7—7 of FIG. 1.

In FIG. 7, the exterior leads 36 are shown bonded by reflow of solder 68 to surface conductive traces 52 on the upper surface 54 of the substrate 50.

Referring to FIG. 7A, a lower portion of a through-hole post 40 is bonded to a lead or circuit 78 on the substrate 50 while the other through-hole post 40 is adhesively secured to the surface of the substrate 50. If desired, both through-hole posts 40 may be reflow soldered to circuits 78 on substrate 50 or both adhesively bonded to the surface of the substrate 50.

Referring back to FIGS. 1 and 3, the heat spreaders 20, 22 are shown with semicircular cutouts 70, which together comprise means for precisely registering the spreaders on the encapsulation material 12. They are shown on each heat spreader 20, 22 as semicircular cutouts aligned with cutouts 76 in the encapsulation material 12. The cutouts 70 permit the use of automated machinery for heat spreader placement. The particular registration means may vary, depending upon the particular manipulation apparatus used.

Figure 4:
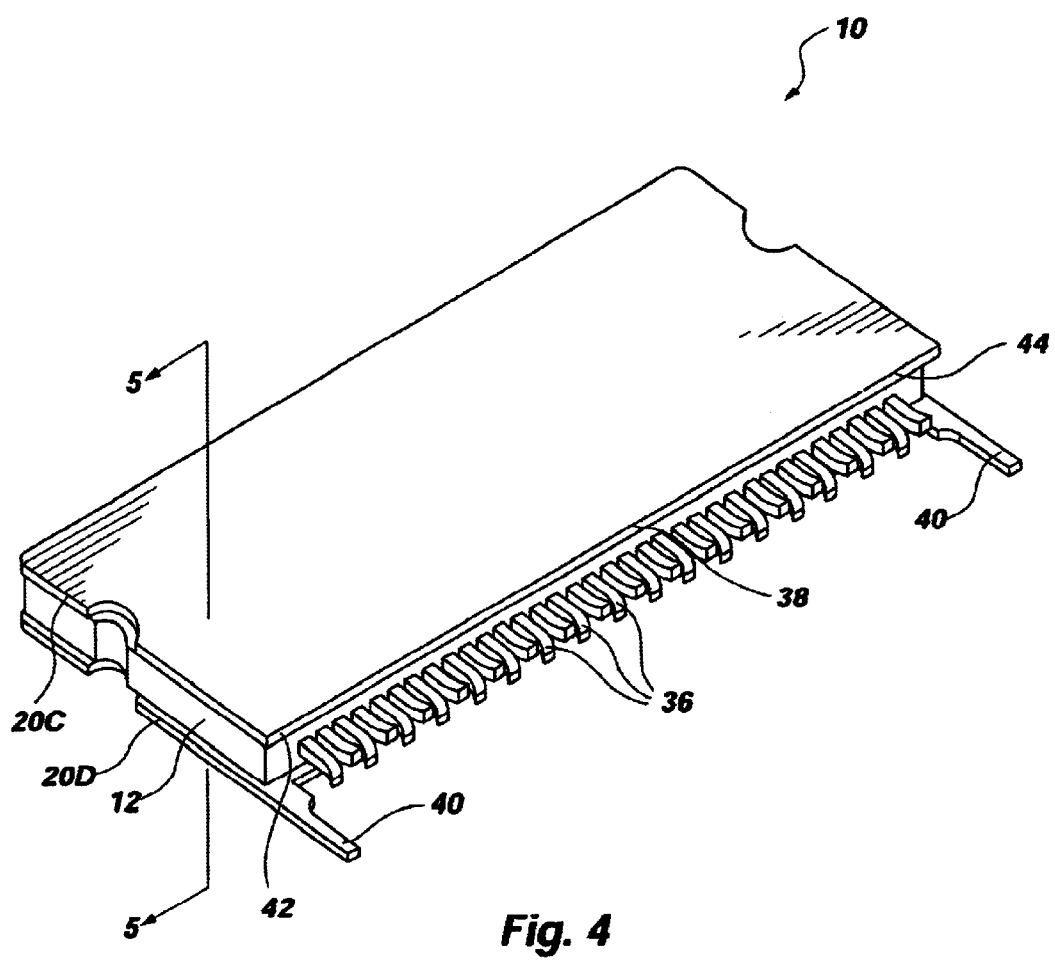
FIG. 4 is a perspective view of a vertical mount IC or semiconductor device having another embodiment of dual heat spreaders of the invention.
Figure 5:
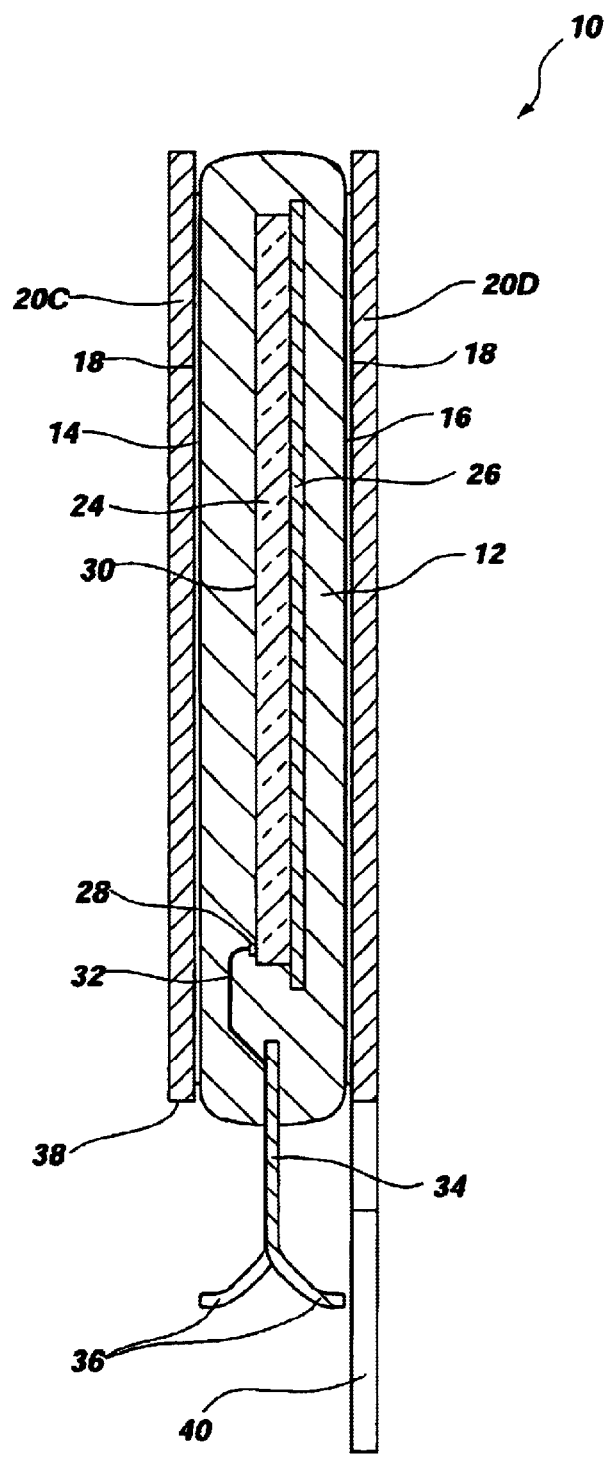
FIG. 5 is a cross-sectional view of another embodiment of an IC or semiconductor device of the invention, as taken along line 5—5 of FIG. 4.

Turning now to FIGS. 4 and 5, another form of the invention is shown as having a pair of heat spreaders. A first heat spreader 20C is formed with no through-hole posts 40, while a second heat spreader 20D has two end-positioned through-hole posts 40. Thus, the completed IC device 10 has two through-hole posts 40, one at each end 42, 44 of the lead edge 38. Only two through-holes 60 in the substrate 50 (FIGS. 7 and 8) are needed to accurately position the IC device 10 thereon for lead attachment.

Figure 6:
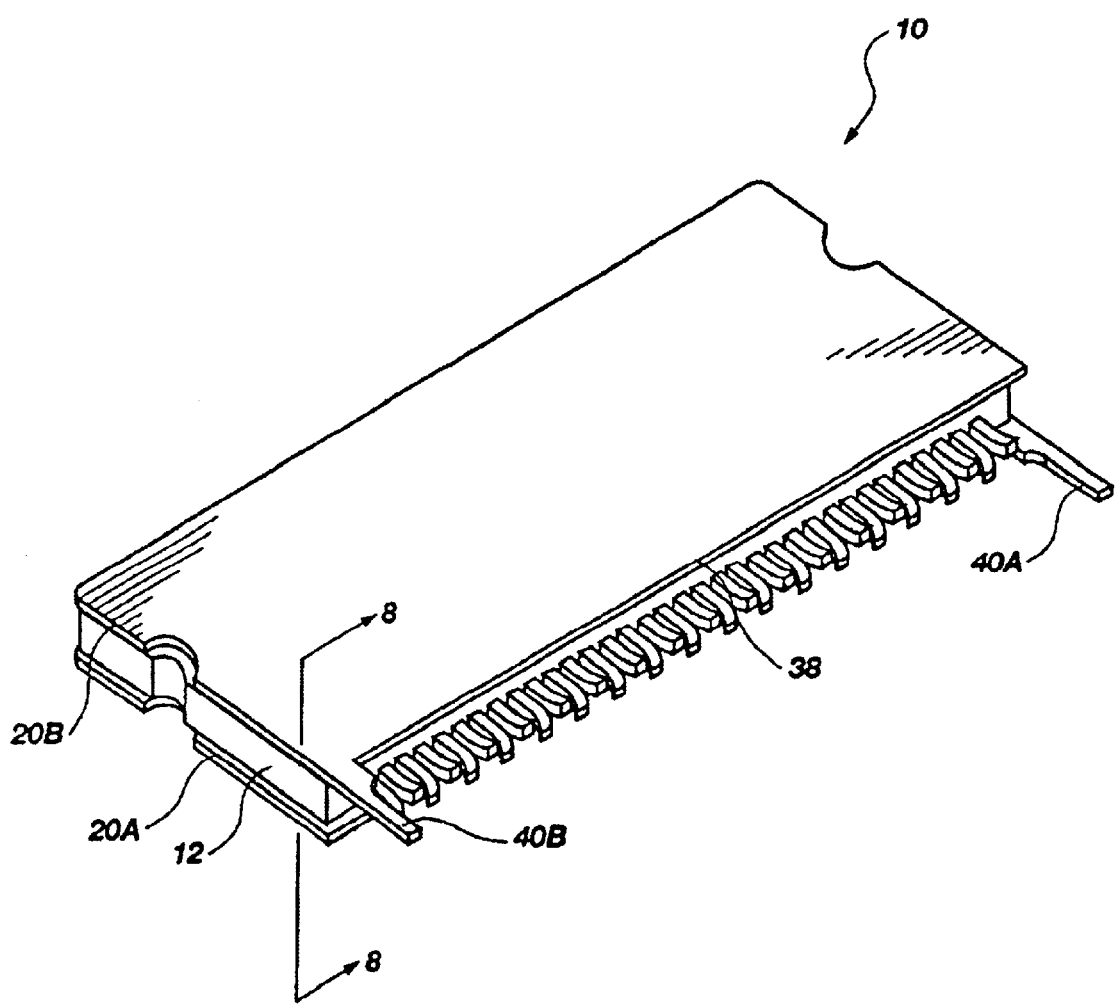
FIG. 6 is a perspective view of a vertical mount IC or semiconductor device having another embodiment of dual heat spreaders of the invention.
Figure 8:
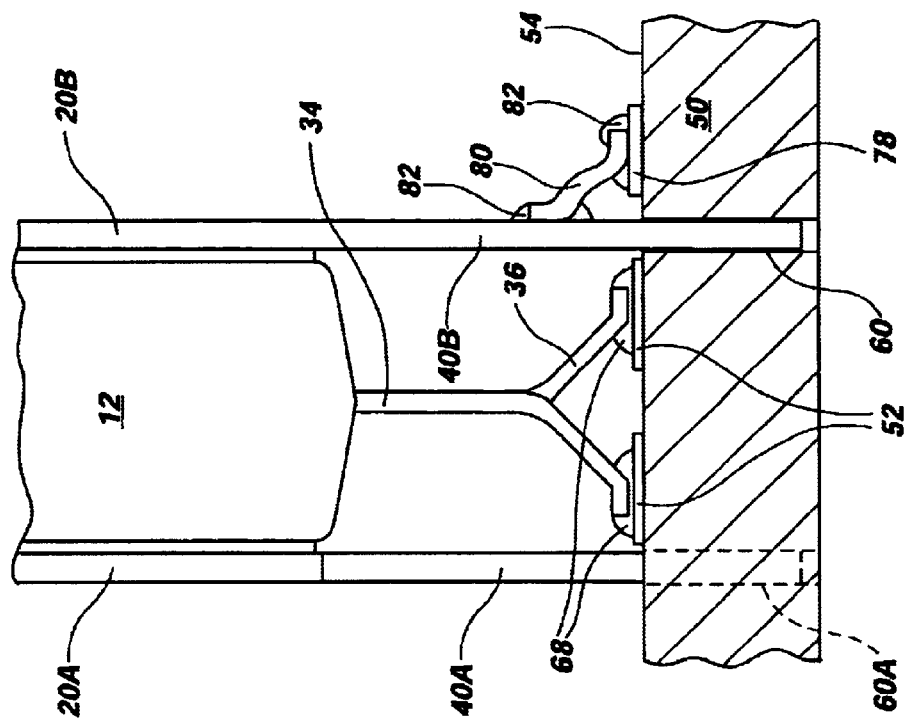
FIG. 8 is a partial cross-sectional view of another IC or semiconductor device of the invention mounted on a substrate, as taken along line 8—8 of FIG. 6.

A further form of the IC device 10 is depicted in FIGS. 6 and 8, where each heat spreader 20A, 20B has one through-hole post 40A, 40B, respectively. The two heat spreaders 20A, 20B are in fact identical, but are in an inverse position relative to each other. Like the embodiment of FIG. 4, only two through-holes 60, 60A are required in the substrate 50 to mount the IC device 10.

In FIG. 8, the exterior leads 36 are shown bonded by reflow of solder 68 to surface conductive traces 52 on the upper surface 54 of the substrate 50.

As shown in FIG. 8, one of the heat spreaders, i.e. 20B, is configured as a ground plane by e.g. connecting it to a ground lead or circuit 78 with a conductor 80 with solder connections 82.

In FIG. 8A, the exterior leads 36 are shown bonded by reflow of solder 68 to surface conductive traces 52 on the upper surface 54 of the substrate 50 while heat spreaders 20A and 20B are shown bonded by reflow of solder 68 to leads or circuits 78 on substrate 50, thereby allowing the use of the heat spreaders 20A and 20B as ground planes when the leads or circuits 78 are grounded.

In each of the embodiments, the heat spreaders 20, 22 may be formed of various materials including a metal such as aluminum or a copper alloy, a metal filled polymer having enhanced heat conductivity, or a ceramic, for example. The preferred material is a metal because of its resistance to breakage and high heat conductivity. Thus, the through-hole posts 40 may have smaller dimensions and the through-holes 60 may have a smaller diameter. The thickness 66 of the heat spreaders 20 may be any suitable thickness for use as a heat spreader.

Figure 9:
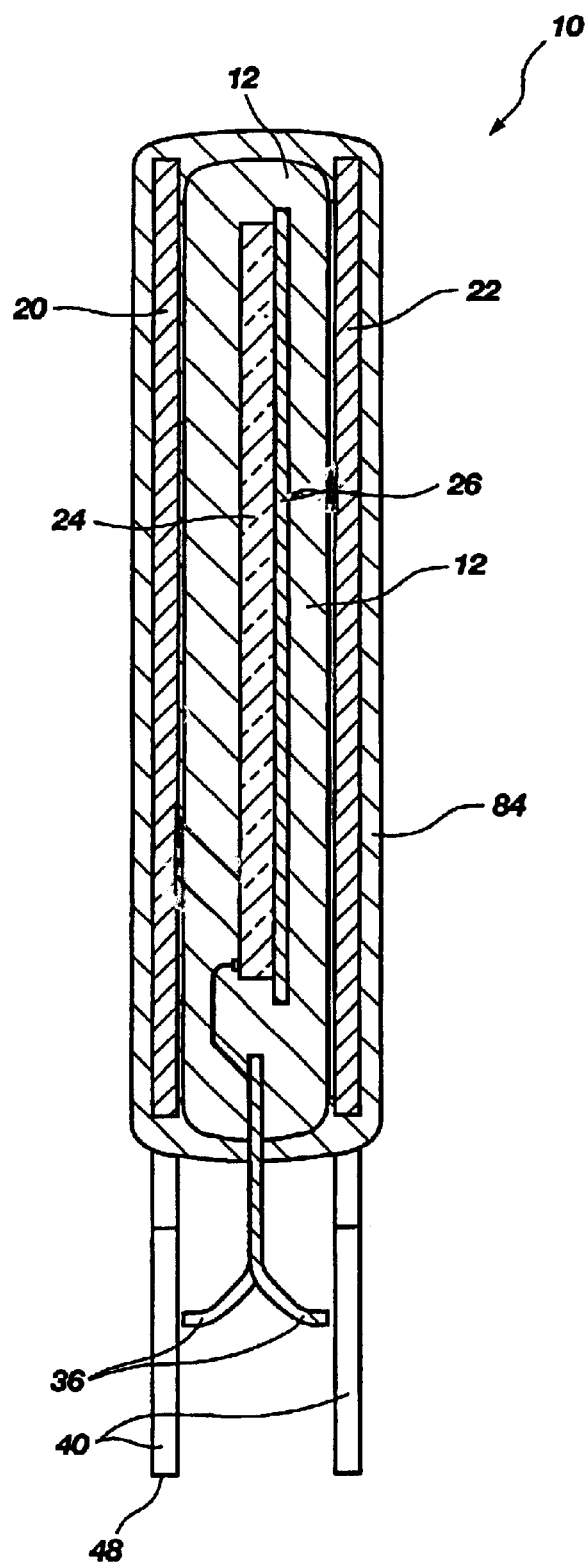
FIG. 9 is a cross-sectional view of an IC or semiconductor device of the invention having encapsulated heat spreaders.

If desired, the device 10 may be encapsulated a second time, following bonding of the heat spreaders 20, 22 to the initial encapsulation material 12. As shown in FIG. 9, the second layer 84 of encapsulant will enclose a major portion of each heat spreader 20, 22, whereby only the exterior leads 36 and the through-hole posts 40 project from the encapsulant. The second layer 84 of encapsulant may be the same as, or different from, the encapsulation material 12 of the first encapsulation step. This second encapsulation step may comprise injection in a mold, for example, or simply overlaying an encapsulant on the surface, since there are no interior spaces into which encapsulant must be injected.

The advantages of the IC device 10 as described are many. First, the dissipation rate of thermal energy is very high. The heat spreaders 20, 22 provide a high degree of protection of the IC device 10 during reflow connection of the exterior leads 36 to a substrate 50.

Second, precise positioning of the IC device 10 for attachment to a substrate is made easier and consistent by use of the through-hole posts 40. Two or less through-holes 60 may be used to provide accurate bonding.

Third, the post-bond stability of the IC device 10 on the substrate 50 is increased, lessening the possibility of damage to the device. The stability may be further enhanced by simple application of an adhesive, reflow solder, etc.

Fourth, the heat spreaders 20, 22 may be easily connected to a ground bus to provide a ground plane or planes for the device. The effects of transient voltage excursions are reduced or eliminated.

Fifth, shielding of the device by metal heat spreaders 20, 22 also provides protection from lead inductance effects.

The heat spreaders are easily formed and easily applied to the device, using readily available materials. Their use does not introduce leakage paths by which destructive moisture and gases may penetrate the interior of the package.

Additional advantages and modifications will readily be recognized by those skilled in the art. Therefore, the invention in its broader aspects is not limited to the specific details and representative devices shown and described herein. Accordingly, various modifications may be made without departing from the spirit or scope of the general inventive concept and embodiments as defined by the appended claims and their equivalents.

What is claimed is:

1. A method for a semiconductor assembly having a semiconductor die having exterior leads extending therefrom comprising:

forming a package using a material, said package having opposing major surfaces, a peripheral edge having a register portion therein and a portion of said exterior leads connected to said semiconductor die projecting therefrom;

forming a pair of heat spreaders, said pair of heat spreaders having at least two posts extending therefrom for contacting at least a portion of a substrate, each heat spreader of said pair of heat spreaders configured to cover a portion of one of said opposing major surfaces, said pair of heat spreaders providing essentially a sole structural support for at least one of said exterior leads, said pair of heat spreaders each comprising a register portion on at least one peripheral edge thereof for accurate mounting to said opposing major surfaces;

attaching said pair of heat spreaders to said opposing major surfaces of said package formed by said material by aligning each of said register portion of said pair of heat spreaders with said register portion of said package to form a recess extending into said opposing major surfaces and each of said pair of heat spreaders; and positioning said pair of heat spreaders so as to provide an opening between distal end portions thereof when forming a final package having portions of said pair of heat spreaders extending therefrom.

2. The method of claim 1, further comprising:

providing a substrate having at least one electrical substrate lead formed thereon; and forming substrate areas in said substrate for insertion of said at least two posts therein to align said exterior leads with said at least one electrical substrate lead.

3. The method of claim 2, further comprising:

inserting said at least two posts into said substrate areas; and connecting said exterior leads to said at least one electrical substrate lead.

4. The method of claim 3, further comprising:

securing said at least two posts to said substrate areas with adhesive material.

5. The method of claim 1, further comprising:

electrically connecting at least one of said pair of heat spreaders to a ground bus.

6. The method of claim 5, wherein a post of said at least two posts of said pair of heat spreaders is connected to said ground bus.

7. A method for forming a semiconductor assembly having a semiconductor die having portions of exterior leads extending therefrom comprising:

forming a package having two opposing major surfaces, a peripheral edge having a register apparatus therein and a portion of said exterior leads projecting therefrom using a material;

forming a pair of heat spreaders, said pair of heat spreaders having at least two through-hole posts extending therefrom for contacting at least a portion of a substrate, each heat spreader of said pair of heat spreaders configured to substantially cover one of said two opposing major surfaces of said package, said pair of heat spreaders each comprising a register apparatus on at least one peripheral edge thereof for accurate mounting to said two opposing major surfaces;

attaching said pair of heat spreaders to said two opposing major surfaces of said package so as to provide essentially a sole structural support for at least one of said exterior leads, said attaching comprising aligning each of said register apparatus of said pair of heat spreaders with said register apparatus of said package to form a recess extending into said two opposing major surfaces and each of said pair of heat spreaders; and positioning said pair of heat spreaders so as to provide an opening between distal end portions thereof for forming a final package.

8. The method of claim 7, further comprising:

providing a substrate having a plurality of electrical substrate leads formed thereon; and forming through-holes in said substrate for insertion of said at least two through-hole posts therein for aligning said exterior leads with said plurality of electrical substrate leads.

9. The method of claim 8, further comprising:

inserting said at least two through-hole posts into said through-holes and attaching said exterior leads to said plurality of electrical substrate leads.

10. The method of claim 8, further comprising:

securing said at least two through-hole posts in said through-holes with adhesive material.

11. The method of claim 8, further comprising:

conductively attaching at least one of said pair of heat spreaders to a ground bus.

12. The method of claim 9, further comprising:

connecting said at least two through-hole posts of said pair of heat spreaders to a ground bus located on said substrate.

13. A method for forming a semiconductor assembly having a semiconductor die having exterior leads connected thereto comprising:

forming a package having two opposing major surfaces and a portion of said exterior leads projecting therefrom using a material;

forming register apparatus on at least one peripheral edge of said package;

forming a pair of heat spreaders, said pair of heat spreaders having at least two through-hole posts extending therefrom, each heat spreader of said pair of heat spreaders configured to substantially cover one of said two opposing major surfaces of said package;

forming register apparatus on said each heat spreader of said pair of heat spreaders, said register apparatus formed on at least one peripheral edge of said each heat spreader for machine positioning and attachment of said each heat spreader on one of said two opposing major surfaces of said package, said register apparatus on said at least one peripheral edge of said each heat spreader comprising cutout portions;

attaching said pair of heat spreaders to said two opposing major surfaces of said package so as to provide essentially a sole structural support for at least one of said exterior leads, wherein said attaching comprises aligning each of said register apparatus of said pair of heat spreaders with said register apparatus of said package to form a recess extending into said two opposing major surfaces and each of said pair of heat spreaders; and positioning said pair of heat spreaders so as to provide an opening between distal end portions thereof for forming a final package having portions of said exterior leads and said at least two through-hole posts extending therefrom.

14. The method of claim 13, further comprising:

providing a substrate having a plurality of electrical substrate leads formed thereon; and forming through-holes in said substrate for insertion of said at least two through-hole posts therein for aligning said exterior leads with said plurality of electrical substrate leads.

15. The method of claim 14, further comprising:

inserting said at least two through-hole posts into said through-holes and attaching said exterior leads to said plurality of electrical substrate leads.

16. The method of claim 15, further comprising:

securing said at least two through-hole posts in said through-holes with adhesive material.

17. The method of claim 13, further comprising:

conductively attaching at least one of said pair of heat spreaders to a ground bus.

18. The method of claim 15, further comprising:

connecting said at least two through-hole posts of said pair of heat spreaders to a ground bus located on said substrate.

19. A method for forming a semiconductor assembly having a semiconductor die having exterior leads connected thereto comprising:

supplying a semiconductor die having exterior leads connected thereto having a portion thereof encapsulated in a material having two opposing major surfaces and four minor edge surfaces connecting said two opposing major surfaces for a package having a portion of said exterior leads projecting from one of said four minor edge surfaces, said four minor edge surfaces having no heat dissipating structures thereon, and register apparatus on at least one peripheral edge of said package;

forming a pair of heat spreaders, said pair of heat spreaders having at least two through-hole posts extending therefrom for contacting at least a portion of a substrate, each heat spreader of said pair of heat spreaders configured to substantially cover one of said two opposing major surfaces of said package;

forming said register apparatus on each heat spreader of said pair of heat spreaders;

attaching said pair of heat spreaders to said two opposing major surfaces of said package so as to provide essentially a sole structural support for at least one of said exterior leads, wherein said attaching comprises aligning each of said register apparatus of said pair of heat spreaders with said register apparatus of said package to form a recess extending into said two opposing major surfaces and each of said pair of heat spreaders; and positioning said heat spreaders so as to provide an opening between distal end portions of said pair of heat spreaders to apply material forming a final package having portions of said exterior leads and portions of said at least two through-hole posts extending therefrom.

20. The method of claim 19, further comprising:

providing a substrate having a plurality of electrical substrate leads formed thereon; and forming through-holes in said substrate for insertion of said at least two through-hole posts therein for aligning said exterior leads with said plurality of electrical substrate leads.

21. The method of claim 20, further comprising:

inserting said at least two through-hole posts into said through-holes and attaching said exterior leads to said plurality of electrical substrate leads.

22. The method of claim 21, further comprising:

securing said at least two through-hole posts in said through-holes with adhesive material.

23. The method of claim 19, further comprising:

conductively attaching at least one of said pair of heat spreaders to a ground bus.

24. The method of claim 21, further comprising:

connecting a through-hole post of said at least two through-hole posts of said pair of heat spreaders to a ground bus located on said substrate.

25. The method of claim 19, wherein said forming register apparatus on at least one peripheral edge of said each heat spreader of said pair of heat spreaders is for machine positioning and attachment of each of said pair of heat spreaders on one of said two opposing major surfaces of said package.

26. The method of claim 25, wherein said register apparatus on at least one peripheral edge of said each heat spreader comprises cutout portions of said each heat spreader.

* * * * *

UNITED STATES PATENT AND TRADEMARK OFFICE
CERTIFICATE OF CORRECTION

PATENT NO. : 6,920,688 B2 Page 1 of 1
APPLICATION NO. : 10/229835
DATED : July 26, 2005
INVENTOR(S) : David J. Corisis It is certified that error appears in the above-identified patent and that said Letters Patent is hereby corrected as shown below:

In the specification:
COLUMN 4, LINE 1, change "soreaders 20, 22" to --spreaders 20, 22--

Signed and Sealed this

Sixth Day of November, 2007

JON W. DUDAS
*Director of the United States Patent and Trademark Office*